United States Patent
Askebjer et al.

(12) 
(10) Patent No.: US 7,150,949 B2
(45) Date of Patent: *Dec. 19, 2006

(54) FURTHER METHOD TO PATTERN A SUBSTRATE

(75) Inventors: Per Askebjer, Akersberga (SE); Hans Fosshaug, Spanga (SE); Robert Eklund, Stockholm (SE); Jonathan Walford, Vallentuna (SE)

(73) Assignee: Micronic Laser Systems AB, Taby (SE)

( * ) Notice: Subject to any disclaimer, the term of this patent is extended or adjusted under 35 U.S.C. 154(b) by 118 days.

This patent is subject to a terminal disclaimer.

(21) Appl. No.: 10/911,412

(22) Filed: Aug. 4, 2004

(65) Prior Publication Data

US 2005/0053850 A1     Mar. 10, 2005

Related U.S. Application Data

(63) Continuation-in-part of application No. 10/634,152, filed on Aug. 4, 2003.

(60) Provisional application No. 60/553,874, filed on Mar. 17, 2004.

(51) Int. Cl.
*G03F 9/00* (2006.01)
*G03C 5/00* (2006.01)

(52) U.S. Cl. .................. 430/30; 430/302; 430/312; 430/328

(58) Field of Classification Search ................ 430/30, 430/302, 312, 328
See application file for complete search history.

(56) References Cited

U.S. PATENT DOCUMENTS

| | | |
|---|---|---|
| 5,774,254 A | 6/1998 | Berlin |
| 6,348,907 B1 | 2/2002 | Wood |
| 2001/0040670 A1 | 11/2001 | Fielding |

*Primary Examiner*—Christopher G. Young
(74) *Attorney, Agent, or Firm*—Ernest J. Beffel, Jr.; Haynes Beffel & Wolfeld LLP

(57) ABSTRACT

The present invention relates to methods for patterning substrates, such as reticles, masks or wafers, which reduce critical dimension variations, improving CD uniformity. In particular, it relates to tuning doses applied in passes of a multipass writing strategy to measurable characteristics of resists or radiation sensitive layers applied to the substrates. Particular writing strategies are described. Aspects of the present invention are described in the claims, specification and drawings.

21 Claims, 9 Drawing Sheets

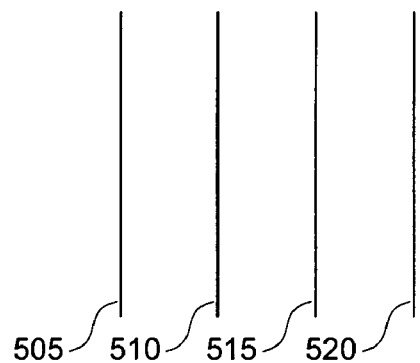
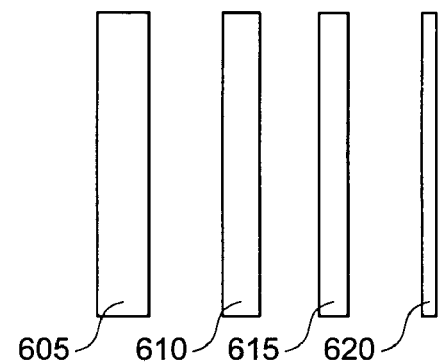
Fig. 5
Fig. 6
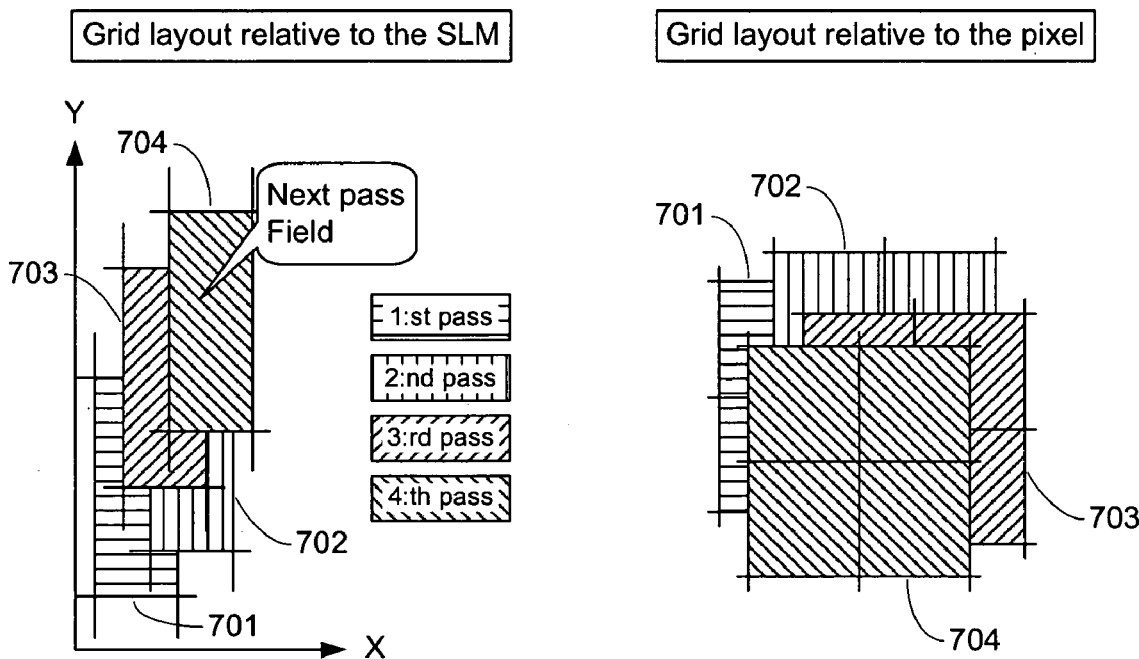
Fig. 7

R: Bulky protective groups

FURTHER METHOD TO PATTERN A SUBSTRATE

RELATED APPLICATIONS

This application is related to and claims the benefit of U.S. Provisional Application No. 60/553,874, entitled "Further Method to Pattern a Substrate," filed 17 Mar. 2004, and further claims priority from and is a continuation-in-part of U.S. application Ser. No. 10/634,152, entitled "Method to Pattern a Substrate," filed 4 Aug. 2003, both of which are hereby incorporated by reference.

BACKGROUND OF THE INVENTION

The present invention relates to methods for patterning substrates, such as reticles, masks or wafers, which reduce critical dimension variations, improving CD uniformity. In particular, it relates to tuning doses applied in passes of a multipass writing strategy to measurable characteristics of resists or radiation sensitive layers applied to the substrates. Particular writing strategies are described.

Semiconductor devices include multiple layers of structure. The structures are formed in numerous steps, including steps of applying resist, then exposing, developing and selectively removing the resist to from a pattern of exposed areas. The exposed areas may be etched to remove material or sputtered to add material. A critical part of forming the pattern in the resist is exposing it. Resist is exposed to an energy beam that changes its chemical properties.

One way of exposing the resist is with a stepper. The stepper uses a reticle, which typically includes a carefully prepared, transmissive quartz substrate overlaid by a non-transmissive or masking layer that is patterned with areas to be exposed and areas to be left unexposed. Patterning is an essential step in the preparation of reticles. Reticles are used to manufacture semiconductor and other devices, such as flat panel displays and television or monitor screens.

A spatial light modulator (SLM) comprises a number of modulator elements, which can be set in a desired way for forming a desired pattern. Reflective SLMs may be exposed to any kind of electromagnetic radiation, for example DUV or EUV for forming the desired pattern on the mask.

SLM writers disclosed in other patent applications, such as WO 01/18606, are related to raster scanning in the sense that it permits a bitmap pattern, but distinct by printing an entire frame of pattern in one flash instead of building the pattern from individual pixels.

The pattern on the reticle used to produce semiconductor devices is typically four times larger than that on a wafer being exposed. Historically, this reduction factor has meant that minimum feature dimensions in the reticles are less critical than the minimum feature dimensions on a surface of the semiconductor. However, a difference in criticality is much less than might be expected and will in the near future disappear.

Critical dimension uniformity (CD uniformity), as a percentage of the line width, is more exacting in the pattern on a reticle than in features on a surface of the wafer. CD uniformity refers to the minimization of variation of a single critical dimension at different points within the pattern. In other words, as the difference in actual dimension of features having the same critical dimension decreases within the pattern, CD uniformity increases. On the wafer, critical dimension uniformity of plus or minus 10 percent of the line width has historically been acceptable. In the error budget for the wafer line width, the mask has been allowed to contribute half of the critical dimension variation, or a variation of five percent of a line width. Other factors use the remaining error budget.

Critical dimension control is becoming more and more critical in the mask making industry as the exposure wavelength goes down. For laser pattern generators, the move from traditional DNQ/Novolak based towards DUV chemically amplified resist processing was initially troublesome. The relative long total exposure time of pattern generators in contrast to wafer steppers, in combination with thick quartz substrates with relatively low heat capacity, may result in reduced lithographic performance due to excessive diffusion of photogenerated acid. The photoresist polymer architecture play a large role in determining the acid diffusion characteristics and thereby also the image fidelity and resolution.

It is anticipated that requirements for critical dimension uniformity will tighten in time, particularly for masks. On the surface of the wafer, a critical dimension uniformity of plus or minus five percent of the line width will be required in the future. At the same time, the mask error enhancement factor is likely to increase due to more aggressive lithographic process trade-offs, such as tuning the lithographic process to optimize the manufacture of contact holes, transistors or other critical features in order to use feature sizes closer to the theoretical resolution limit. For masks, a critical dimension uniformity of plus or minus one percent of a line width or feature size is anticipated. At this rate, the tolerance for critical dimension errors on the mask will be smaller in absolute nanometers than it is on the surface of the wafer, despite the fact that the stepper takes advantage of a mask that is four times as large as the area on the wafer that is being exposed.

Thus, it is desirable to develop improved methods for patterning reticles or wafers, which will further reduce the critical dimension variation.

SUMMARY OF THE INVENTION

Accordingly, it is an object of the present invention to provide a method of producing small features on a substrate with precise critical dimension.

The present invention relates to methods for patterning substrates, such as reticles, masks or wafers, which reduce critical dimension variations, improving CD uniformity. In particular, it relates to tuning doses applied in passes of a multipass writing strategy to measurable characteristics of resists or radiation sensitive layers applied to the substrates. Particular writing strategies are described. Aspects of the present invention are described in the claims, specification and drawings.

Figure 2:
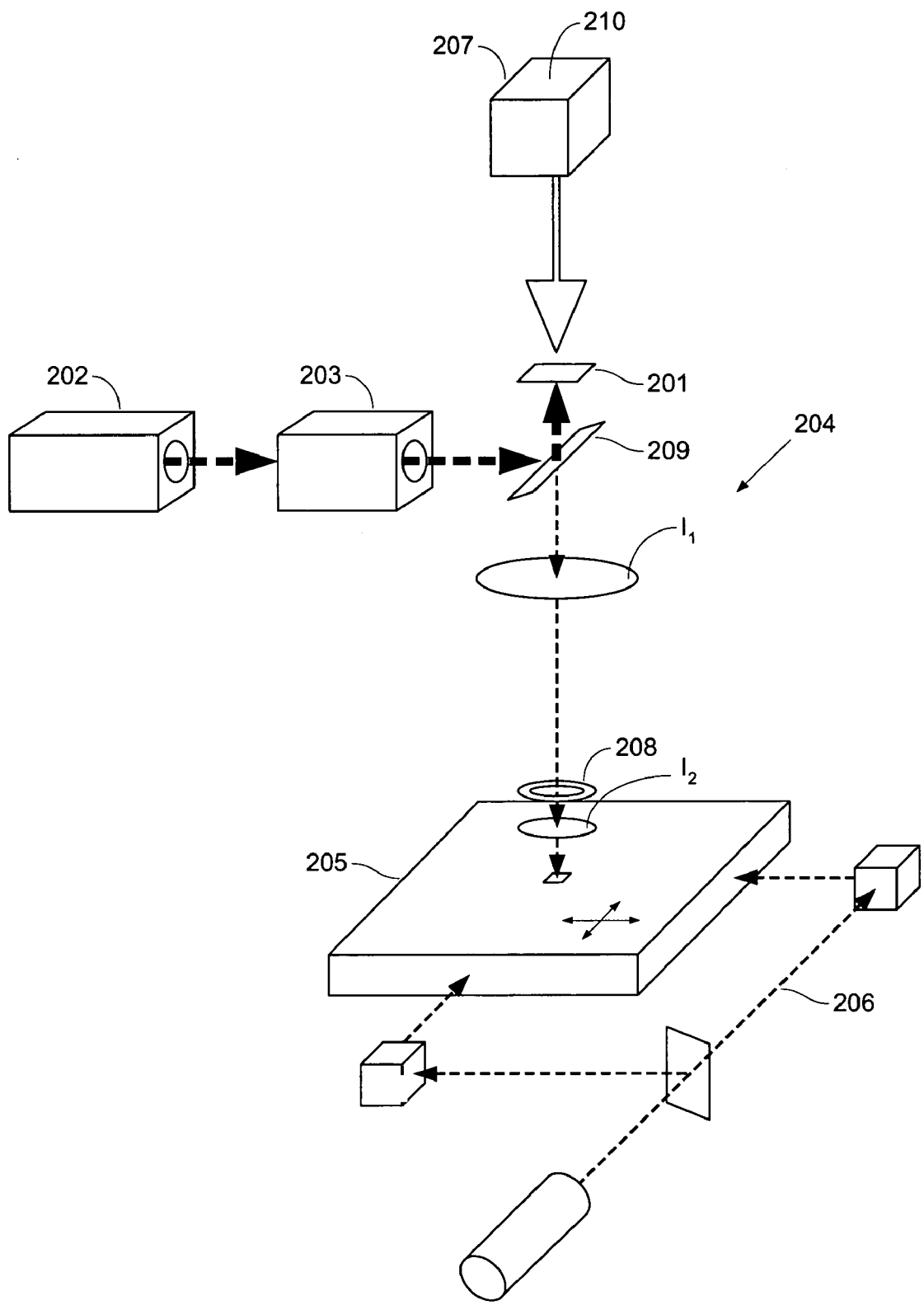

The system principle of the Sigma7300 is shown in FIG. 2.

Figure 3A:
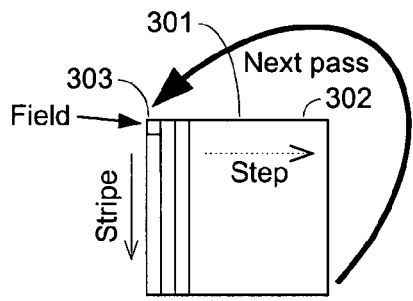
Figure 3B:
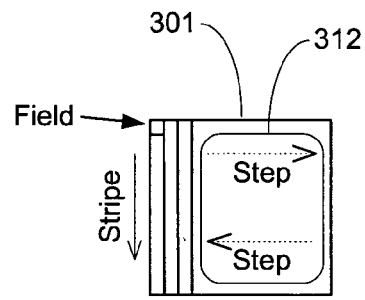
Figure 3C:
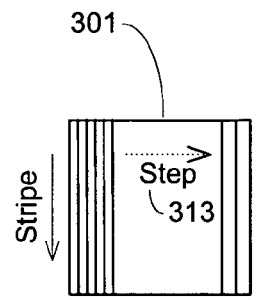

The regular writing scheme as well as some other alternatives used in this investigation are shown in FIG. 3. FIG. 3a illustrates a regular writing mode, FIG. 3b a reversing writing mode, and FIG. 3c an interlaced writing mode.

Figure 4:
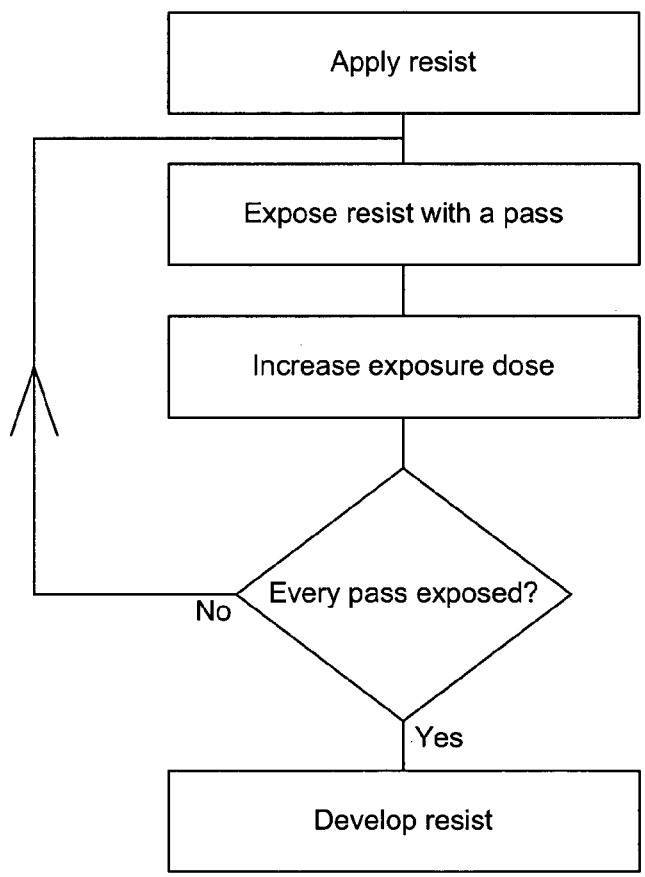

FIG. 4 illustrates a flow chart of an embodiment of patterning a workpiece according to the present invention.

In FIG. 5, four lines are exposed using 4 writing passes.

FIG. 6 illustrates said four lines after exposure.

A deprotection reaction is schematically shown in FIG. 7.

Figure 8:
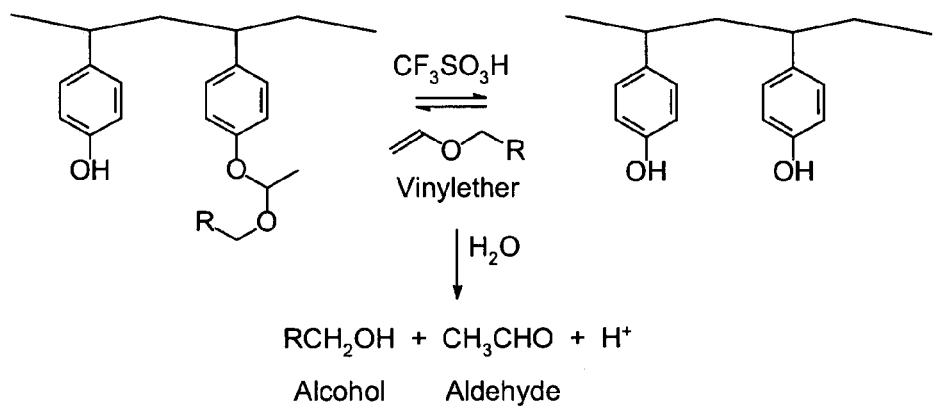

FIG. 8 is a schematic of a deprotection reaction for DX 1100P chemistry.

Figure 9:
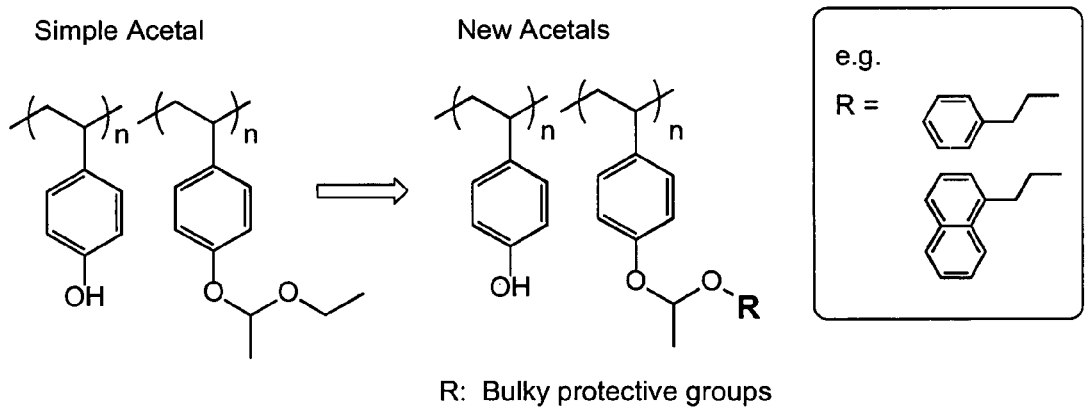

The use of bulky acetal blocking groups is shown FIG. 9.

Figure 10:
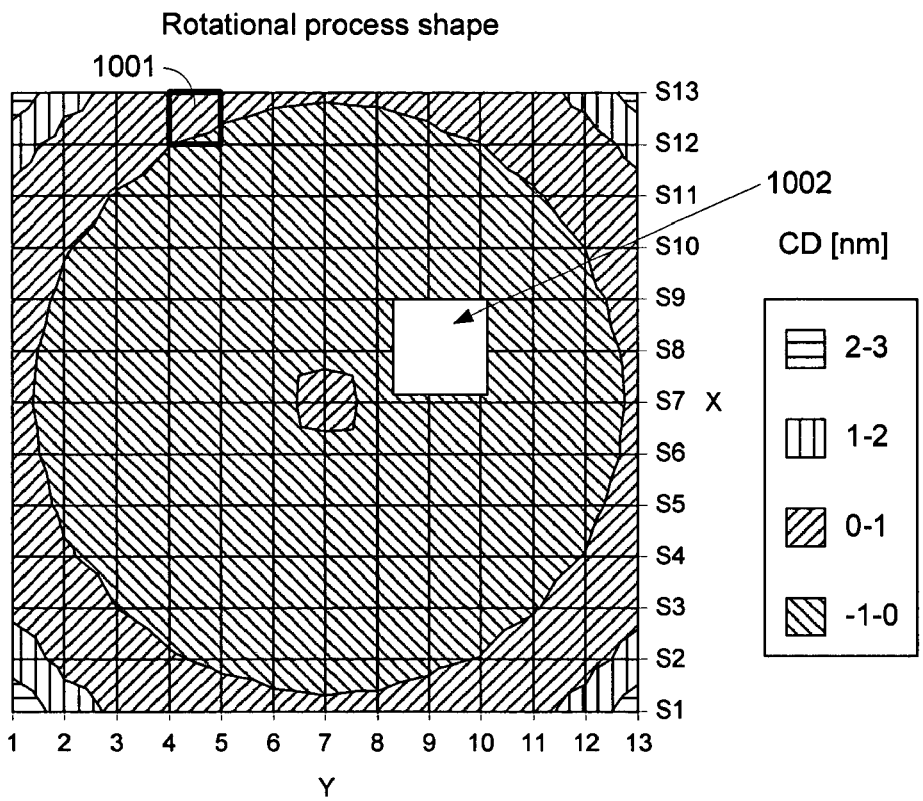

FIG. 10 illustrates fitting measured rotational process characteristics with a test pattern location.

Figure 11:
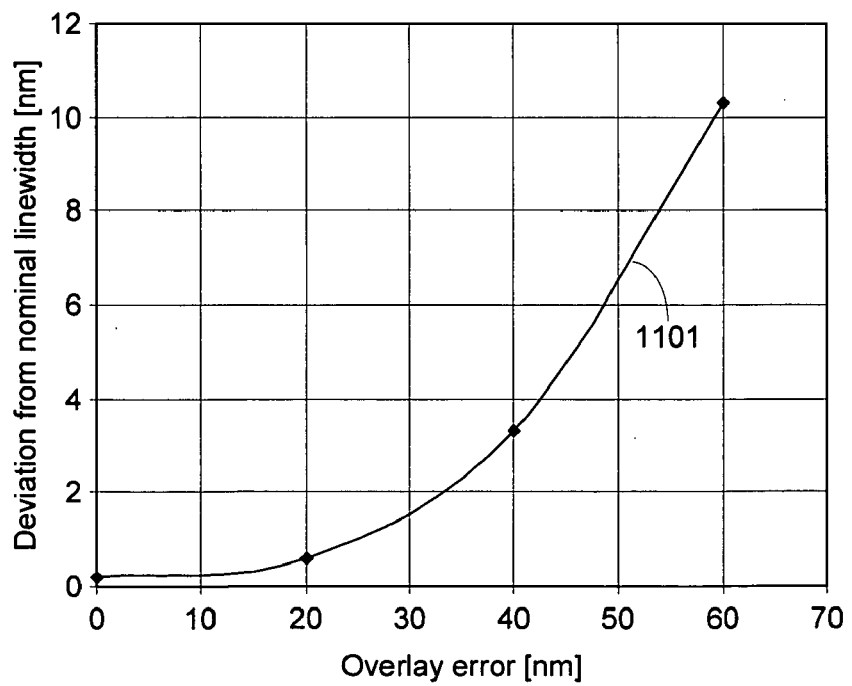

FIG. 11 graphs overlay error between two passes.

Figure 12:
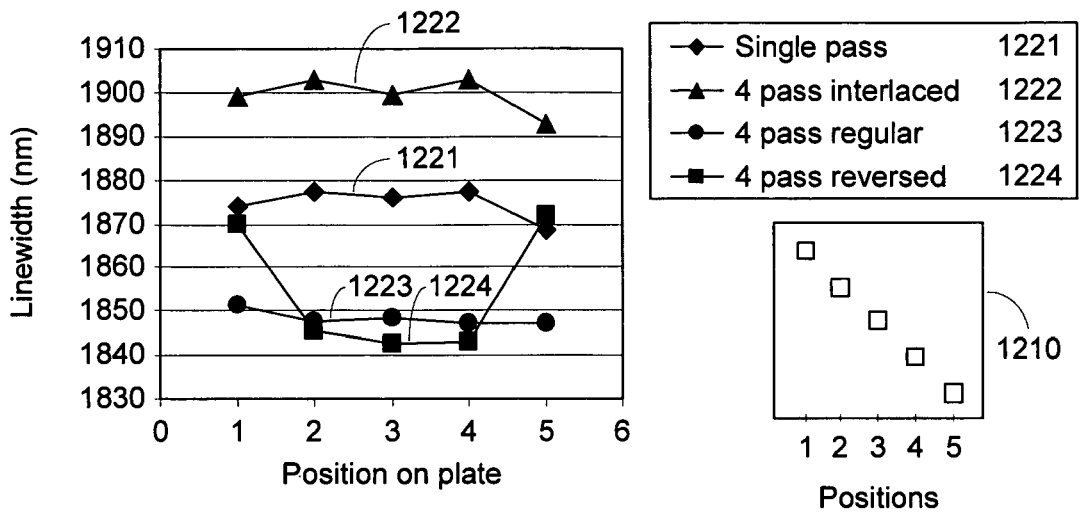

FIG. 12 illustrates exposures on five locations of the mask using different writing strategies.

Figure 13:
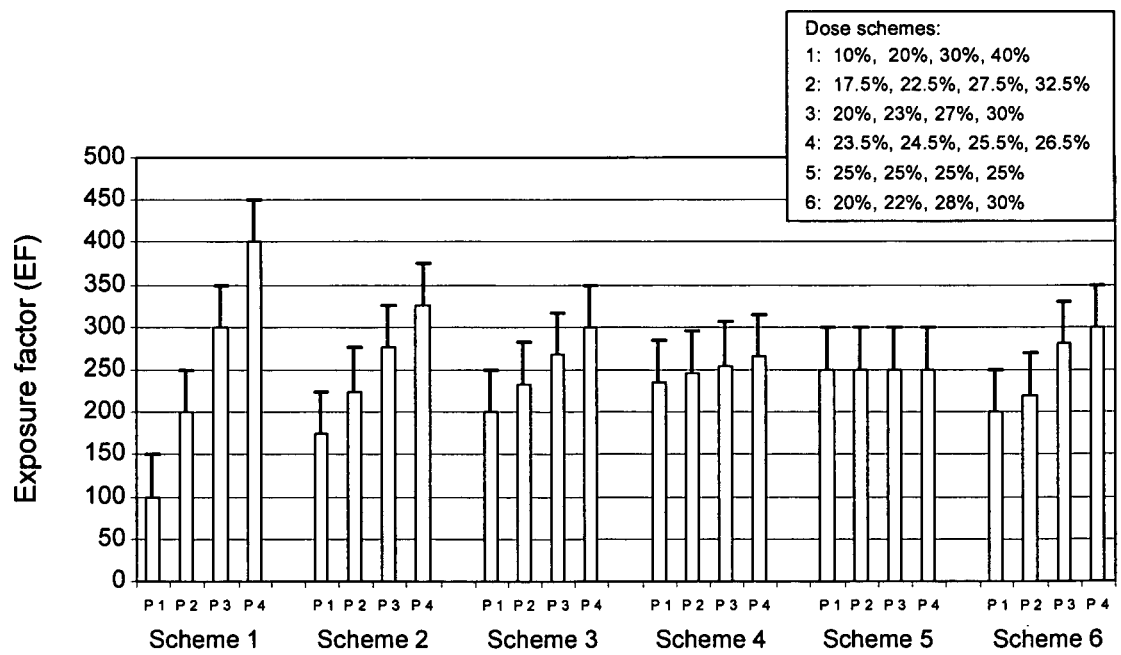

Six experimental combinations were written 4 times, as shown in FIG. 13.

Figure 14:
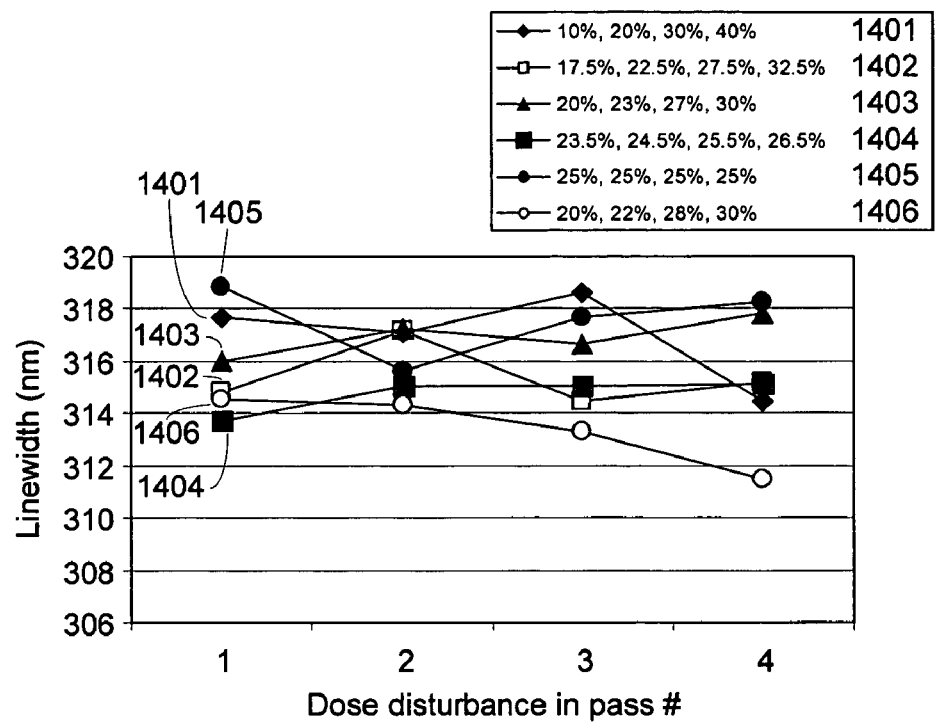

In FIG. 14, an intentional disturbance was 50 exposure factor units was applied during various writing passes.

Figure 15:
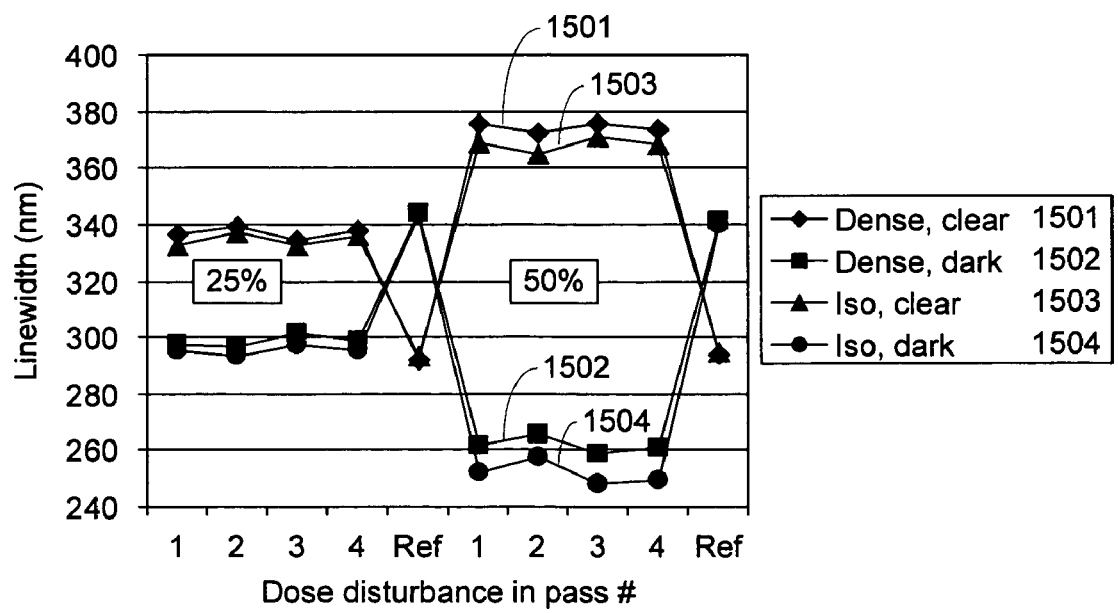

The effect of higher disturbance doses of 25 and 50 percent (250 and 500 exposure factor units) is shown in FIG. 15.

Figure 16:
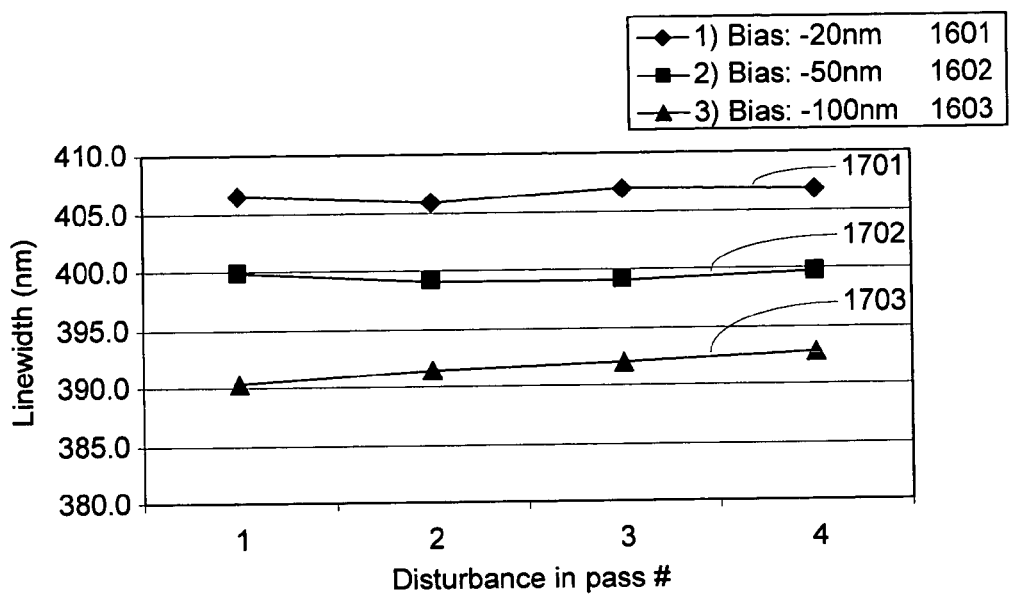

A second set of trials, illustrated in FIG. 16, was conducted to determine the effect of negative dose biases.

Figure 17:
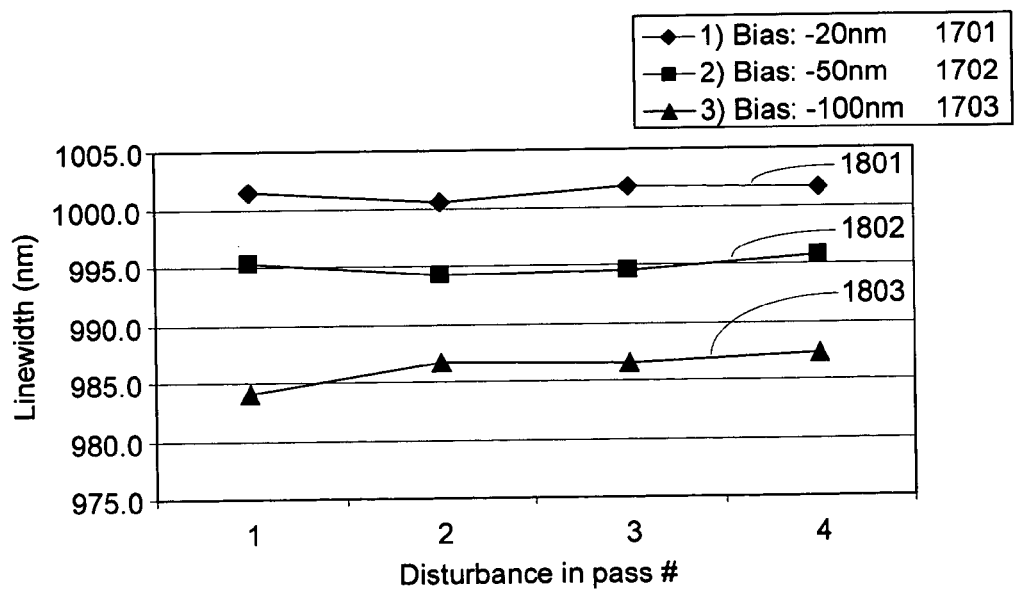

FIG. 17 applies the negative line width biases to a nominal feature size of 1000 nm.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
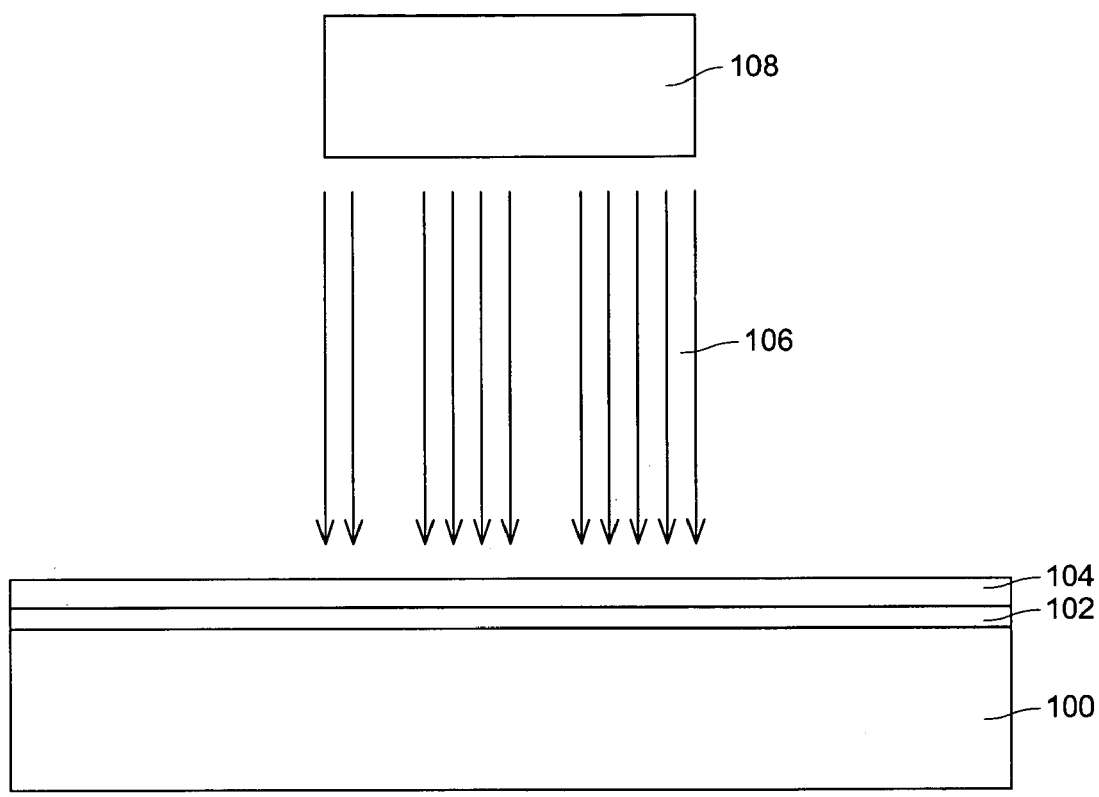
FIG. 1 depicts a coated substrate including a masking or non-transmissive layer and a resist layer or radiation sensitive.

FIG. 1 depicts a coated substrate 100 including a masking or non-transmissive layer 102 and a resist layer 104. The substrate 100 may be a quartz substrate, an Erodent ceramic substrate or an ULE™ glass substrate when said substrate is to be a reticle or mask. However, when making integrated circuits by direct writing, said substrate may by any kind of semiconducting material. In such case the resist is applied directly onto said substrate.

The mask is formed over the transmissive substrate to block the passage of an energy beam in areas where resist on a wafer are intended not to be exposed. Unmasked portions of the substrate 100 allow an energy beam to pass through and form a pattern on the wafer resist.

The non-transmissive masking layer 102 typically includes a chrome layer approximately 40–90 nm thick. Said chrome material may be applied by sputtered deposition. Alternatively, aluminum, gold, tungsten, or silicon could be used to form the non-transmissive, masking layer.

The resist layer, or radiation sensitive coating, may be spun on using conventional techniques to form a layer approximately 0.05–0.20 micron thick. Said resist could be a positive resist or a negative resist. Resists used with photon energy may be referred to as photo resists. Other types of resist are used with other forms of energy, such as electrons, atoms etc. The radiation or energy 106 may be any of wide variety of types. Photon energy may be in the UV, the DUV, EUV, or x-ray spectrum ranges. For instance, photon energy may be generated by a helium cadmium source (approximately 442 and 325 nm) a krypton ion source (approximately 413 nm). Photon energy may also be generated by an excimer source or a krypton-fluoride or an argon-fluoride laser (approximately 308, 248, 193, 157 or 126 nm). The resist may be a chemically amplified resist (CAR), for example DX 1100 from Clariant. The resist may also be a traditional positive or negative non-amplified resist such as Novolak. Other examples of resists are FEP 160 or 171 from Fujifilm.

Exposure of the resist is performed by using a pattern generator. For photon energy, a laser pattern generator or an interference lithography system may be used. For electrons, an electron-scanning device may be used. Etec, a subsidiary of Applied Materials, sells an ALTA™ line of scanning laser pattern generators. Micronic Laser Systems of Täby, Sweden sells Omega™ line of scanning laser systems and Sigma™ line of micromirror-based systems. The NanoStructures Laboratory, working with the University of Wisconsin in some aspects, has described interference lithography systems with spatial periods of 200 nm, 100 nm, and 50 nm.

Object pixel 108 in FIG. 1 may therefore be a reflected radiation from a micromirror in an SLM, a beam spot from a scanning laser system, an electron beam, x-ray beam etc.

1. Introduction

The need for higher resolution is the driving force in the development of photoresist materials and lithographic exposure tools. Traditionally diazonaphtoquinone (DNQ)—Novolak based resists have been used in optical mask manufacturing. A couple of years ago deep ultraviolet (DUV) laser pattern generators utilizing positive chemically amplified resists (CARs), were introduced on the market due to their excellent resolution, contrast and photospeed. However, CARs show inherent problems with respect to process stability, especially latent image information loss due to delays between exposure and post-exposure bake. T-topping or closure of the resist features at the resist-air interface might occur due to airborne molecular base contamination, causing neutralization by amines of the photogenerated acid. In contrast to DNQ/Novolak based resists, chemically amplified DUV resists, in general, rely upon both photochemical and thermally driven reactions. The imaging generates acid from the exposure of the photoacid generator (PAG). Then diffusion and reaction of the acid with the blocking group at elevated bake temperatures causes the change of polymer matrix from hydrophobic to hydrophilic behavior thereby increasing the dissolution rate of the exposed region. Exposure sensitivity increases by increased post-exposure bake temperature, but at the same time this may be accompanied by loss of exposure latitude. The degradation of the linewidth dimension control and process latitude is related to the increased acid diffusion at increasing temperatures and the efficiency of the acidolysis reaction at the edge of an exposed region.[1] The acid diffusion phenomenon is also one of the contributors to line end shortening (LES) and line edge roughness (LER). The strength and size of the photogenerated acid is very important for the excursion of the acid mobility and thus for image fidelity. The tuning of each component in the resist formulation is vital in order to obtain good lithographic performance.

Mask fabrication conditions differ somewhat from wafer processing, making the design of a suitable DUV resist candidate material for masks more challenging. Early, the interest was focused on low-activation energy, acetal-blocked polymers due to their excellent stability. However, for low activation energy (low-Ea) resists there may be a lateral diffusion of the formed acid simultaneous with the deblocking reaction during the exposure event. These two effects in conjunction with the relatively long exposure times for photomasks (a couple of hours), in comparison with the short exposure time of wafers (orders of minutes), could result in pronounced linewidth variation. The long exposure time also increases the risk of amine contamination. Furthermore, the post exposure bake (PEB) adds extra diffusion complexity. The relatively thick quartz substrate makes the thermal control more difficult than for thin silicon wafers, due to the larger thermal mass and much lower thermal conductivity of the quartz substrate.

The mask industry would benefit from a resist capable of exceptional linewidth control without the use of bottom or top antireflective coatings (used in the wafer industry to minimize effects of substrate contamination and reflectivity as well as airborne contamination) due to defectivity, process complexity and cost reasons. The resist should also have extraordinary post coat delay and photospeed stability properties while maintaining all the other general requirements. This combination of stability requirements constitutes a challenge for the resist manufacturers. Some of the different issues in designing a resist suitable for maskmaking conditions are shown in Table 1. The majority of today's commercial resists aimed for the silicon wafer industry are designed for use together with bottom antireflective coatings (BARCs) and to be stable for much shorter time frames than found in mask fabrication. The usage of clustered and environmentally controlled process tools in the wafer industry has facilitated this design approach.

The integration of chemically amplified resists in photomask processing was not straightforward due to the latent image degradation caused by acid neutralization. Neutralization of photogenerated or catalytic acid is due to airborne base contamination[2] at the resist-air interface or by base contamination at the resist-substrate interface, resulting in T-topping and footing respectively, as well as by acid diffusion into nonexposed areas. Thus, CARs are very prone to interfacial and surface phenomenon. Factors that influence the image blur are acid diffusion, the catalytic length of the regenerated acid, the composition of the photoresist polymer, additives, temperature and time[3–8]. Diffusion phenomena not only affect the ultimate resolution, but may also have an impact on the isofocal bias and on proximity effects. Among the different types of commercial resists available at the time of the introduction of DUV laser pattern generators, the low activation energy resist AZ DX 1100P (from here and onwards referred to as DX 1100P) by Clariant Corporation was soon identified as a suitable candidate material due to its prescribed superior stability towards amine contamination and acid diffusion barrier properties and exceptional photospeed shelf-life (precoated mask blanks should last as long as 9 months). PED stability of more than 24 hours was reported[9,10]. However, it turned out that DX 1100P showed severe standing wave and footing characteristics[11] beside non-sufficient PED stability[12]. For the Sigma7300 laser pattern generator from Micronic Laser Systems, a switch to FEP-171 (Fujifilm Arch) resist improved the overall situation dramatically[13].

TABLE 1

Some design issues for a DUV resist in mask fabrication.

| Characteristic | Performance | Comment |
| --- | --- | --- |
| Strong PAG | Good PEB sensitivity Good substrate compatibility | Poor T-topping |
| Mobile PAG (small) | Good substrate compatibility | Poor T-topping Poor linewidth slimming |
| PAG type Thermal stability Soluble photoproducts | Good photospeed shelf-life Good defect control Type of onium salt | |
| Hydrophobic polymer | Good water insolubility/good shelf-life Substrate compatibility | Poor defects on dark fields |

TABLE 1-continued

Some design issues for a DUV resist in mask fabrication.

| Characteristic | Performance | Comment |
| --- | --- | --- |
| Low activation energy | Good T-topping, PEB sensitivity | Maybe poor shelf-life |
| Mobile base | Maybe better substrate compatibility Maybe better CD control | Maybe shelf-life issues |

2. Writing Strategy of the Sigma7300 System

The system principle of the Sigma7300 is shown in FIG. 2. It utilizes a spatial light modulator (SLM) for exposure of the mask. Referring to FIG. 2, a pattern generator comprises an SLM 201 with individual and multi-value pixel addressing, an illumination source 202, an illumination beam scrambling or homogenizing device 203, a beam splitter 209, an imaging optical system 204 including lens L1 and L2 and aperture 208 (typically a Fourier filter), a fine positioning substrate stage 205 with an interferometer position control system 206 and a hardware and software data handling system 207 for the SLM. For proper functionality and ease of operation it also contains a surrounding climate chamber with temperature control, a substrate loading system, software for timing of stage movement and exposure laser triggering to achieve optimum pattern placement accuracy and a software user interface. Pattern data is rasterized and loaded into the SLM chip, that acts as a reflective computer-controlled reticle. It reflects the excimer laser flash and the image of the pattern is focused onto the mask blank. The stage with the mask blank moves continuously and the interferometer commands the laser to flash when it reaches the position for the next field. Because of the short flash time, around 20 ns, the movement of the stage is frozen and a sharp image of the SLM is produced in the resist. The SLM is reloaded with a new pattern in time for the next flash. Finally, to feed the pattern into the SLM, a parallel and scalable datapath design handles the complex design data of state-of-the-art IC designs[14].

A four-pass writing strategy is employed for averaging purposes and it is optimized to achieve minimum linewidth and positioning variation across the mask. Each pass is written in the same direction across the substrate, with an offset relative to previous passes. The fields that build up the pattern are stitched together using an overlap to minimize linewidth variation over the stitching boundary. The regular writing scheme as well as some other alternatives used in this investigation are shown in FIG. 3. FIG. 3a illustrates a regular writing mode, FIG. 3b a reversing writing mode, and FIG. 3c an interlaced writing mode. Each diagram shows a mark 301 on stage, stripes 302, fields 303, and a stripe printing direction. The step directions are 311, 312 and 313, respectively. In the regular writing strategy 3a, the first pass of a field is printed in a stripe 302 and then the next strip of fields is exposed after a small stage movement 311. After printing the whole mask blank, the stage moves back to the initial position and the second pass is exposed in the same way as the first. This procedure is then repeated for the third and fourth pass. In the reversed mode, the exposure occurs in the same fashion as for regular mode with the exception that now the second and fourth pass are exposed in the reverse direction 312. In the interlaced mode, all the four passes are exposed directly after each other before any stage movement 313 occurs. Thus, the Sigma7300 offers different options with respect to writing strategies. But furthermore, the datapath of Sigma7300 is flexibly designed to handle any future writing scheme.

One device that can be used to evaluate perturbation effects is an SLM writer such as the Sigma 7300. Its writing grid layout of Sigma7300 is shown in FIG. 7. The field grid is shifted in quarters of SLM fields between passes 701, 702, 703, 704. In addition, a shift on the pixel grid is made to create symmetric contacts and line ends. Putting the four passes on the same pixel grid creates unwanted skewed contacts and line ends[15]. FIG. 7 shows the grid layout from both SLM and pixel perspectives.

FIG. 4 illustrates a flow chart of an embodiment of patterning a workpiece according to the present invention. In a first action, the resist, electromagnetic sensitive coating or coating sensitive to particular particles, is applied onto the substrate according to conventional techniques well known for anyone with ordinary skill in the art. In a second action said resist is exposed with a first pass having a given exposure dose. There are different ways of patterning a substrate using multi pass strategy. A first way is to pattern a first portion with every pass immediately after each other before starting to expose another portion with every pass. Another way would be to first expose the complete wafer or substrate with the first exposure pass, and when finished, starting all over again from start position with the following pass. This is continued until the full wafer is fully exposed. Instead of starting from start position, every second pass could be exposed in the reversed direction. It is also possible to randomize the portion, which is to be exposed.

Before starting with the second exposure the dose, which is going to expose the resist, is increased. The increase of dose is preferably chosen out of the resist, which is going to be patterned, and the number of passes, which is going to complete a full exposure. The dose may be increased or decreased between every pass, which means that every pass to be exposed will have a higher/lower exposure dose than the pass just exposed. After having fully exposed the workpiece, said workpiece is developed according to well-known techniques.

An operator operating the pattern generator, which is used for exposing the substrate, could manually set the increase of dose between passes. Said increase of dose could also be stored and chosen automatically by the machine after having given information of what kind of resist is going to be exposed and what the number of passes the operator wishes to use. If the operator is not satisfied with the automatically chosen exposure doses for the different passes he or she might change one or a plurality of them.

The actual dose for each pass may, according to one embodiment, be chosen to optimize the critical dimension uniformity. Critical dimension uniformity doses are likely different for different resists or emulsions. One way of determining the optimal dose for each writing pass in a multi-pass writing strategy for optimizing the critical dimension uniformity may be as follows. In FIG. 5, four lines are exposed using 4 writing passes. In a state of the art 4 pass writing strategy, each pass is given the same dose, i.e., 25% of an exposure threshold. The exposure of the resist is a cumulative effect, which means that one can choose between applying the full dosage in a single writing pass or dividing the dosage among a number of writing passes. Multi-pass writing is preferred because the strategy evens out defects in one or a plurality of the writing passes. For a particular resist, the exposure takes place when a certain dose has been impinged onto said resist. Below the exposure threshold, no exposure takes place. The transition from unexposed to exposed is relatively sharp and well-defined.

One way to determine the effect of each pass is to introduce a perturbation in each pass and see how the perturbation affects the CD. In a first writing pass, the perturbation is assigned to a first line 305. The perturbation could be a change in dose or a change in dimension of the line. Imagine that the perturbation is a small dose variation, for instance an increase of 2%. In the first writing pass, the first line is exposed with 27% of the exposure threshold, and a second line 510, a third line 515 and a fourth line 520 are exposed with 25% of the exposure threshold. In a second writing pass, the perturbation is assigned to the second line 510. In a third writing pass, the perturbation is assigned to the third line 515, and in a fourth writing pass, the perturbation is assigned to the fourth line 520.

Having completed said four exposures of said four lines, where one line is distorted in each writing pass, a CD measurement is performed for said lines. FIG. 6 illustrates said four lines after exposure. The width of the lines are somewhat exaggerated for reason of clarity only. From the FIG., it is apparent that the first line 605 has a higher CD than the second line 610, the second line 610 has a higher CD than the third line 615 and the third line 615 has a higher CD than the fourth line 620. This illustrates that a perturbation affects a pattern more if it is introduced in an earlier writing pass than in a later writing pass, given that the writing dose is assumed to be equal for each writing pass.

It has been experimentally shown that an earlier writing pass with a specific writing dose will affect the resist more than a later writing pass with the same dose. A perturbation in a first writing pass will have a greater impact than the same perturbation in a second or later writing pass. In a multipass writing strategy where the different passes are at least partially superimposing each other, said effect may also be more or less pronounced in that a regular pattern may be seen. Said regular pattern may correspond to such areas in the first writing pass where sub patterns are overlapping. Another effect of the fact that later writing passes with the same dose, as earlier writing passes will affect the resist less than the earlier writing passes is that butting errors may be more or less pronounced. CD uniformity may depend on which writing pass a particular pattern is butted. When creating a complete pattern utilizing a micro mirror device (SLM) to generate said pattern to be printed onto the substrate, several stamps of numerous object pixels are stitched together in each writing pass. Said stamps may be partially overlapped in butting regions. If using the same dose in each writing pass, a characteristic pattern may emerge representing butting areas from the first writing pass.

3. Photoresist Chemistry 3.1 DX 1100P Photoresist Chemistry

DX 1100P is a first generation 248 nm DUV resist from Clariant Corporation and was aimed for low-reflective substrates. DX 1100P (Mw>>10.000) consists of (poly)4-hydroxystyrene (PHS), dissolved in polyglycol methylether acetate (PGMEA), as the backbone material with an acetal-based protection group (less volatile, more bulky vinylether than simple acetal) and triphenylsulfonium triflate (boiling point=162° C.) as the photoacid generator (PAG) and triphenylsulfonium hydroxide as the photodecomposable base[9, 10] (PDB). The nature of the substitution results in a high degree of hydrophobicity (protection degree approx. 30%). The added base is fixed to the polymer chain causing the base induced diffusion effects to be negligible. During exposure the PAG generates a strong organic sulfonic acid, trifluoro methane sulfonic acid (CF3SO3H) that catalyzes the decomposition of the protecting acetal group. As with all poly-acetals, there is an absolute need for one equivalent of water per deprotection for the reaction to proceed. The PAG forms a medium-strong and small, fast diffusing acidic specie upon irradiation. The small size leads to a high diffusion coefficient. The strength (pKa) of the acid is carefully matched to the basicity of the acetal-protecting group and the desired PEB temperature. The pKa value for CF3SO3H (a.k.a. triflic acid) has been reported to be >−12 [16]. The subsequent thermolysis of the resist, mediated by the acid catalyst, fragments the protecting groups. The deprotection reaction is schematically shown in FIG. 7. Being a low-activation energy (Ea) resist, Ea<20 kcal/mol, the major part of the deprotection occurs at room temperature, during exposure. Upon exposure, the PDB is fragmented into diphenyl sulfide and a highly reactive phenyl radical, which recombine to polymeric phenol. The main idea behind adding bases is that the acid molecules diffusing from the exposed areas into the unexposed areas are trapped and neutralized by the photodecomposable base.

FIG. 8 is a schematic of a deprotection reaction for DX 1100P chemistry.

3.2 FEP-171 Photoresist Chemistry

FEP-171 from Fujifilm Arch is a resist that can be used both for e-beam and optical applications. In the search for a successor material to DX 1100P, focus was set on FEP-171 due to its good performance in terms of resist profiles and environmental stability as well as being commercially available for the mask community by Hoya Mask Blank Division, supporting the industry with precoated mask blanks.

Since the chemistry of FEP-171 is proprietary, no detailed information is revealed here. However, FEP-171 is a two-component PHS based resist with additives to control the basicity, molecular size and function. Amine additive limits the acid mobility and is also used to improve PCD and PED stability and shelf life. Solvent used is a PGMEA/PGME mixture. The use of bulky acetal blocking groups (FIG. 9) and a special class of photo-acid generator improve the profile, resolution and dissolution contrast in comparison to simple acetal-formulated resists[17]. The PAG itself is fairly large and strong and generates a slow-diffusing acid during the photolysis. In case of FEP-171, the polymer deblocking reaction takes place mostly in the PEB step, not during exposure, and this makes a difference from the simple acetal-formulated resists. Nevertheless, the bulky acetal polymer requires only a little aid of thermal energy for its deblocking reaction to proceed. Therefore, the resist does not need to suffer from too aggressive diffusion of the catalytic acid driven by the heat, which is mostly the case for high-activation energy blocking chemistry. This unique design of the polymer allows FEP-171 to exhibit good PED stability, not only under atmospheric pressure but also in vacuum, as well as very small sensitivity to PEB temperature.

4. Experimental Conditions and Methodology 4.1 Processing and Lithographic Evaluation Commercially coated AR8 chrome mask blanks were used. The blanks were coated with either DX 1100P or FEP-171 photoresists. All mask blanks were exposed on Micronic Laser Systems Sigma7300 DUV mask writing system. The masks were baked on a STEAG Hamatech APB5000 hotplate, equipped with zone controlled hotplate and amine filter from Extraction Systems. The bake temperature was 70° C. in case of DX 1100P and 120° C. in case of FEP-171 and the ramp-up time was 180 s and steady-state time was 60 s in both cases. The temperature variation across the plate was less than 1° C. during ramp-up and less than 0.2° C. at steady-state. The masks were then developed on a STEAG Hamatch ASP5000 system using AZ726MIF (2.38 wt % tetra methyl ammonium hydroxide, TMAH) surfactated developer (Clariant Corporation) using a combined spray-puddle develop for 60 s. The metrology system used to measure the patterned mask blanks was a KLA8250R top-down CD-SEM.

To minimize the possible effect of airborne contaminants on the resist profile and resist dissolution time, the interval between process steps were held constant and as short as possible. The delay time between exposure and post-exposure bake as well as between post-exposure bake and development was less than 5 minutes respectively. The total amine concentration was between 8 and 12 ppb in the cleanroom. After exposure, the mask blanks were loaded into SMIF boxes inside the exposure chamber and thereafter transported manually to the hotplate. The exposure tool was equipped with amine filter from Extraction Systems, and the total molecular base concentration was typically less than 1 ppb inside the climate chamber.

4.2 Linewidth Error Sources

Both the exposure tool and the process equipment are potential CD error sources in this investigation. Utilizing the knowledge about these specific equipment characteristics enables us to cancel or at least minimize their impact on sought parameters. Hence, a number of steps were taken to minimize error contribution from the exposure system and the process equipment. The most obvious of all are maybe the global process contribution, i.e. radial line width variations originating from the rotational characteristics of the developer process. Using a local pattern with reference structures minimizes the contribution from this error source. A typical linewidth range for a fitted rotational characteristic is less than 5 nm across an entire 6-inch mask. Left are non-systematic errors in the developer process. These are dealt with by averaging repeated measurement cells. The experiment is based on relative measurements within each cell and a cell 1001 is less than a few mm². This error is estimated to be less than 1 nm, because the cell 1001 is very small relative to the characteristic length scale of the process variation between CD regions indicated by hatch patterns in FIG. 10.

The exposure tool requires a more thorough discussion. As known from the experiment setup description, impact of a disturbance in one pass on line width is related to the line width of an undisturbed line. By exposing without an offset between the passes, contributions from the SLM are cancelled, because the same area on the SLM is used for each pass. Thereby each pass is exposed under the exact same SLM conditions. Linewidth repeatability between fields is less than the repeatability of the measurement tool (dynamic repeatability: 2 nm). All measurement sites are avoiding the stitching area between fields to remove a possible error source.

Linewidth is found to be rather insensitive to overlay between passes. As seen in FIG. 11, the overlay error 1101 needs to be more than 40 nm for the linewidth to be affected significantly more than the repeatability of the measurement tool. The used exposure tool overlay error between passes is typically less than 15 nm (3σ). Overlay of the tool used under normal exposure conditions is much better. Because the data shown in the FIG. is for overlay error between two passes, a smaller linewidth error is expected from four passes. Estimated overlay induced linewidth error is less than 1 nm.

Dose variations result in more photogenerated acid before PEB and thus a higher degree of polymer deprotection. Pulse-to-pulse stability of the laser affects linewidth through the dose sensitivity of the exposure tool/resist system combination. At the exposure dose in this investigation the sensitivity is 1.5 nm/% dose change for both the DX 1100P and the FEP-171 resists, and the dose stability of the laser is less than 1% (standard deviation). This leads to a laser variation induced linewidth variation of 1.5 nm in both cases.

Focus stability of the exposure tool is better than 50 nm (3σ) including setpoint error. Focus affects the achieved linewidth through the relation between linewidth, focus and exposure (Bossung plot). As the exposure was performed close to isofocal dose the relation between linewidth and focus is flat. Estimation of the linewidth error originating from focus variations is less 2 nm.

Time delay between passes will also affect the achieved linewidth. It is assumed that photogenerated acid in the nominally non-exposed areas due to diffraction or scattering of light can be neglected. Due to the fact that there is an effect of the time delay between passes in the case of DX 1100P, the delay time was kept constant within seconds. This error is estimated to be less than 0.5 nm assuming an exponential behavior of CD as a function of the time between passes.

Temperature variations during PEB may result in linewidth variations. An increase in PEB temperature do not change the amount of acid produced from photolysis, however, the added energy increases the acid mobility and thereby the level of deprotection. Measurements on FEP-171 indicate a temperature sensitivity of 0.3 nm/° C. and the literature reports less than 1 nm/° C. for DX 1100P. Temperature uniformity specifications on the used bake system is 0.2 o ° C. at steady state and 1° C. during ramping, yielding an error of less than 1 nm generated by the bake system.

All error sources are assumed to be independent of each other and can therefore be added orthogonally. The resulting total error from all these known error sources add up to:

$$\text{Error}_{total} = \sqrt{\begin{array}{l}(\Delta CD_{pulse\text{-}to\text{-}pulse})^2 + (\Delta CD_{overlay})^2 + (\Delta CD_{focus})^2 + \\ (\Delta CD_{time\ delay})^2 + (\Delta CD_{PEB})^2 + (\Delta CD_{develop})^2\end{array}}$$

where

ΔCDpulse-to-pulse=total CD error induced by laser pulse-to-pulse variations

ΔCDoverlay=total CD error induced by overlay

ΔCDfocus=total CD error due to focus variations

ΔCDtime delay=total CD error induced by time delay effects between exposure event and PEB ΔCDPEB=total CD error induced by temperature variations during PEB ΔCDdevelop=total CD error induced by the develop process Inserting actual figures yield that the total error#(Errortotal) >>3.1 nm

4.3 Influence of Printing Mode

In order to study the influence of exposure path and time delays between each shot, different variations of four-pass printing was investigated using resist DX 1100P. Single pass exposure was also employed as a reference. In four-pass printing, 25% of the total nominal dose was used in each pass. Printing of a full mask blank was simulated by adopting a time scheme for the shots in order to control the time delay between each exposure. Exposure was done on only five locations on the plate, depicted as 1–5 in 1210 of FIG. 12. The time delay between writing at the five locations was 15 minutes, to simulate writing the whole plate Nominal feature size was 2 mm and clear crosses were measured in a SEM to determine the change in linewidth for all cases.

In an early trial, a close relationship was observed between the change in critical dimension and the applied dose. Said relationship could be expressed as $\Delta CD \approx k \cdot \Delta dose$, where CD is expressed in terms of nm, k is a constant and dose is expressed in terms of percentage of the exposure threshold. The constant k at isofocal dose is for Clariant DX1100 approximately 1.5.

Given the relationship between the change in CD and the change in dose it is possible to predict an optimal dose distribution out of the CD measurement above. To optimize the CD uniformity, one wants each pass to affect the resist equally, i.e., introducing a perturbation in any of the writing passes should give rise to the same effect.

For DX 1100 a dose distribution giving optimal CD uniformity when using four pass writing strategy is 20% in the first writing pass, 23.3% in the second writing pass, 26.7% in the third writing pass and 30% in the fourth writing pass.

As can be seen in FIG. 12, the most dramatic effect on the linewidth occurred when using reverse printing mode 1224. The fact that exposure locations 1 and 5 on the plate received two shots almost immediately after each other, in reverse printing mode caused the linewidth to increase remarkably at those sites. It can also be seen from the FIG. that four-pass interlaced mode 1222 resulted in broader trench dimensions than single pass mode. On the other hand, the regular printing mode resulted in smaller linewidth than single pass mode 1221. Thus, depending on writing strategy, different nominal linewidth will be obtained when using DX1100P. However, by applying an offset in the data, this effect could be eliminated for all modes except reverse printing mode 1224. In another experiment, mentioned above, it was clear that the first exposure pass had the major impact on the final linewidth when using DX1100P. This leads us to perform experiment with progressive dose scheme instead of using a equidose four-pass scheme. During the optimization process of the concept of progressive dose, a switch from DX1100P to FEP-171 chemistry was made due to excessive resist footing and standing waves in the former material. Therefore, all the following investigations reported herein were done using the FEP-171 photoresist.

4.4 Influence of Dose Scheme

Besides the effect of printing mode, the influence of applied dose in each pass was also investigated. A progressive dose scheme was tested in order to obtain better linewidth uniformity across the plate. Two approaches were applied, either the disturbance in one of the passes consisted of an increase in dose (exposure factor) or by biasing the designed linewidth data.

All six combinations were written 4 times, first with the disturbance in the first pass, the second time with the disturbance in the second pass, etc., which yielded 24 combinations in total, as shown in FIG. 13. The graph shows six schemes and per pass dosing factors, both in terms of exposure and percentage of total exposure. A total of 1000 dosing units corresponds to a single pass printing exposure. The vertical axis is an exposure factor. The thin bars above wider bars indicate a dose disturbance of plus 50 exposure factor units perturbation when the defects were intentionally introduced.

In the first experiment, depicted by FIG. 14, the intentional disturbance was 50 exposure factor units, which corresponds to a 5% variation in dose, represented by the error bars in FIG. 13. The feature size was nominally 320 nm. The resist used was FEP-171. The resulting line widths (indicated by the vertical axis) are graph for application of a dose disturbance in the pass numbers indicated by the horizontal axis. Line widths are narrower than nominal, because the features measured were clear features.

The effect of higher disturbance doses of 25 and 50 percent (250 and 500 exposure factor units) is shown in FIG. 15. For each of the disturbance doses, trials are shown with disturbances in each of the four writing passes and without disturbances. Measurements were done on clear features, determining whether the line width was above or below the nominal 320 nm line width. A second set of trials, illustrated in FIG. 16, was conducted to determine the effect of negative dose biases, expressed in terms of projected line width. These line width biases were applied as negative disturbances in the various writing passes. The line width biases applied were −20, −50 and −100 nm. The nominal feature size was 400 nm. Measurements were again done on clear features. The larger bias 1603 indicated a trend of more effect in the first writing pass than the subsequent writing passes. FIG. 17 applies the same negative line width biases to a nominal feature size of 1000 nm. Again, the larger bias 1703 indicated a trend of more effect in the first writing pass than the subsequent writing passes.

5. Discussion

The properties of the photoacid generator and the associated acid generation and catalysis in a chemically amplified resist play a governing role in determining the lithographic performance. Therefore the chemistry of the two investigated resists will be discussed and the implications this might have on writing strategy of the Sigma7300 laser patter generator. The strength of the photogenerated acid may influence parameters such as photospeed, dose-to-size, deprotection efficiency, post exposure delay stability and post-exposure bake sensitivity. The acid size impact mobility, acid loss, resolution, standing waves as well as delay stability. In general, a small, strong acid results in high deprotection efficiency and high acid diffusion. The opposite would then valid for a large, weak acid in terms of acid diffusion and deprotection efficiency. An acid with relatively low strength and small size would lead to low deprotection efficiency and high diffusion. Following, an acid with low strength and large size would infer low deprotection efficiency and less acid diffusion. Acids, which have high vapor pressure and low boiling point, could easily escape the exposed areas during exposure and/or PEB.

The local acid concentration is directly proportional to the aerial image. At the edge of the feature there will be a sloped intensity profile and thus an acid gradient formed. In a situation where there exist a shallow acid gradient, the driving force for diffusion is less than the case where the acid gradient is more sloped. There will be a competing process between present, low-concentrated acid, which will react with the polymer matrix ahead of the threshold acid concentration front and the corresponding acids. The acid mobility may increase due to increased free volume in the polymer matrix caused by gaseous or resin plastization reaction by-products. It has been shown that the gaseous products rapidly desorb from the film and that the generated free volume does not permanently remain[18].

The acid diffusion coefficient D and the diffusion length L can be calculated by using the following equations[19]:

$$D = \frac{\sigma k T}{[H^+]q^2}$$

where
  s=ion conductivity
  k=Boltzmann constant
  T=absolute (diffusion) temperature
  [H+]=amount of acid (concentration)
  q=ionic charge The diffusion length, L, can be calculated from $L=\sqrt{2Dt}$, where t=bake (diffusion) time.

It is evident from the diffusion coefficient and diffusion length equations that the acid diffusion length, in general, will increase at higher PEB temperatures and longer bake times. On the other hand, higher doses yield higher acid concentrations and thereby decreased diffusion coefficient and thus shorter diffusion length. However, as the dose increases, the ion conductivity will also increase which will then increase the diffusion coefficient according to the diffusion coefficient equation above. The influence of dose on acid diffusion length is therefore not just a simple one. In addition, the smaller the ionic charge of the acid, the larger the diffusion coefficient and thereby larger diffusion length.

DX 1100P, forming a relatively small and strong acid upon exposure, could suffer from excessive acid diffusion despite being buffered with amines. On the contrary, amine buffered FEP-171, forming a relatively large and strong acid during exposure, would thus show less impact on acid diffusion. However, by adopting the proper writing strategy the negative delay effects of DX 1100P or similar acting resists could be counteracted. FEP-171 in turn, show ideal behavior for a laser writer since the effect of dose per pass is additive and that virtually no deprotection occurs during exposure and thus no simultaneous acid diffusion or acid-catalyzed reactions before post-exposure bake. This should render FEP-171 insensitive to choice of writing strategy.

There is also a possibility that the remaining solvent contents vary between the two resists. The solvent enhance the mobility of the photogenerated acid[5]. DX1100P was typically baked at 70° C. while FEP-171 was baked at 120° C., thus the remaining solvent content should presumably be less in case of FEP-171. This fact may also lower the acid mobility and the diffusion length. Due to lack of information about the counter-ion in FEP-171, no specific comparison can therefore be made between the two resists and the possible implication that the counter-ion may have on acid diffusion.

The Sigma7300 laser pattern generator employs a four-pass offset printing strategy. Reducing the number of passes would increase the throughput and be beneficial with respect to time delay effects. But, at the same time the CD uniformity and overlay/registration accuracy could become worse.

The choice of proper writing strategy is therefore crucial in order to be able to squeeze out the maximum lithographic performance of the mask writer. The flexibility built-in making it possible to choose the timing sequence of the passes and the dose scheme as well as the direction of printing, reduces the impact of image blur caused by acid diffusional phenomena. This inherent feature of the Sigma7300 laser pattern generator thus makes the influence of DUV resist chemistry on i.e. resolution and CD uniformity to become dramatically reduced.

6. Conclusions

In this paper the influence of some of the components in the Sigma7300 writing strategy on lithographic performance of two chemically amplified resists (DX 1100P and FEP-171) were studied. Depending on the photogenerated acid and its diffusional properties, the choice of writing strategy may be very important for linewidth control. The timing between the exposure passes was found to cause a linewidth variation when using DX 1100P resist. It was found that the reversed writing mode was especially non-preferable when printing on DX 1100P coated plates due to relatively large linewidth variation across the plate. Initial process stability issues associated with DUV chemically amplified resists in optical mask fabrication have now been heavily reduced in the Sigma7300 laser pattern generator by the usage of the photoresist FEP-171. FEP-171 has shown to exhibit good performance due to the polymer architecture involved, namely low diffusional PAG and bulky blocking groups, which require relatively high activation energy for deprotection to occur. In fact, FEP-171 was rather insensitive to applied dose and linewidth disturbances and thus seems not to require a specific writing strategy. Nevertheless, the possibility of adjusting the dose per pass and printing direction in an intelligent fashion makes the Sigma7300 exposure tool very flexible with respect to DUV resist architecture.

Some Particular Embodiments

The present invention may be practiced as a method or device adapted to practice the method. The same method can be viewed from the perspective of configuring a dosing strategy, exposing a sensitive layer on a substrate, or producing a structure of a device. The invention may be an article of manufacture such as media impressed with logic to develop or implement a writing strategy of increasing doses among writing passes.

One embodiment of the present invention is a method of lithography for enhancing uniformly critical dimensions of features pattern onto a workpiece coated with a layer sensitive to an energy beam, using an energy beam in a multipass writing strategy. This method includes determining individual doses for writing passes so that the passes will affect the energy sensitive coating equally, thereby enhancing the uniformity of critical dimensions of features. The method further includes exposing the coating using a multipass writing strategy, applying the individual doses in the writing passes. It optionally may further include developing the coating.

Further aspects of this embodiment may include creating the features using a spatial light modulator. Practicing this embodiment, the energy beam may be a pulsed radiation in the range of EUV to DUV. A modulator and deflector arrangement may be used, capable of deflecting and setting the intensity of the radiation beam to create the features. Alternatively, a diffraction grating could be used to create the features.

The exposure could be produced in two or more writing passes. A first writing pass could use radiation amounting to less than half an exposure threshold and the second writing pass could use more than half an exposure threshold. Alternatively, the exposure could be produced in three or more writing passes. In three or more passes, the dose would increase from pass to pass. The dose might increase linearly, exponentially or logarithmically. The exposure also could be produced in four or more writing passes.

During writing, the whole workpiece could be exposed the first writing pass before any of it is exposed to the next writing pass. Portions of the workpiece could be exposed in the same direction or in alternating directions.

Another aspect of this embodiment is that the dose of the last exposure pass may be 40 to 60% higher than the first exposure pass with one resist or 45 to 55% higher with another resist. The resist use may be chemically amplified resist. Workpiece may be a mask substrate or wafer.

From another perspective, this disclosure may be practiced as a method of producing a mask or a reticle, using the embodiment described above, wherein the workpiece is a mask or reticle and a method further includes patterning the workpiece. The patterning step may follow developing the coating. Or, it may be practiced as a method of producing a layer of the device structure using the embodiment described above. Then, the workpiece would be a wafer and the method would further include patterning the wafer. Alternatively, it may be practiced as a method of producing precise structures on a second workpiece using the embodiment described above, wherein the first workpiece is a mask or reticle. This method would further includes exposing a layer of radiation sensitive material on a second workpiece, and using the mask or reticle and patterning a layer of the device structure on the second workpiece using the exposed layer on the second workpiece.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

REFERENCES

1. S. A. MacDonald, N. J. Clecak, H. R. Wendt, C. G. Willson, C. D. Snyder, C. J. Knors, N. B. Deyoe, J. G. Maltabes, J. R. Morrow, A. E. McGuire, and S. J. Holmes, "Airborne Chemical Contamination of a Chemically Amplified Resist", Advances in Resist Technology and Processing XIII, Proceedings of SPIE, Vol. 1466, pp. 2–12(1991).

2. S. A. MacDonald, W. Hinsberg, R. Wendt, N. Clecak, and C. G. Willson, Chem. Mater., 5, p. 348 (1993).

3. E. A. Dobisz, T. H. Fedynyshyn, D. Ma, L. M. Shirey, and R. Bass, Journal of Vacuum Science and Technology, B16(6), p. 3773 (1998).

4. P. L. Zhang, A. R. Eckert, C. G. Willson, and S. E. Webber, "Acid Diffusion Through Polymer Films", Advances in Resist Technology and Processing XII, Proceedings of SPIE, Vol. 3049, p. 898 (1997).

5. L. Schlegel, T. Ueno, N. Hayashi, and T. Iwayanagi, "Determination of Acid Diffusion in Chemical Amplification Positive Deep Ultraviolet Resists", Journal of Vacuum Science and Technology, B9 (2), March/April, pp. 278–289 (1991).

6. A. R. Pawloski, Christian, P. F. Nealey, "Micromolar Concentrations of Base Quenchers Impact the Apparent Efficiency of Photogeneration in Chemically Amplified Resists, Journal of Vacuum Science and Technology, B20 (5), September/October, pp. 2162–2168 (2002).

7. T. H. Fedybyshyn, C. R. Szmanda, R. F. Blacksmith, W. E. Houck, and J. C. Root, "Relationship Between Resist Performance and Reaction Order in a Chemically Amplified Resist System, Journal of Vacuum Science and Technology, B11 (6), November/December, pp. 2798–2806 (1993).

8. F. A. Houle, W. D. Hinsberg, M. I. Sanchez, and J. A. Hoffnagle, "Influence of Resist Components on Image Blur in a Patterned Positive-tone Chemically Amplified Photoresist", Journal of Vacuum Science and Technology, B20(3), May/June, pp. 924–931, (2002).

9. Georg Pawlowski, "Acetal-based DUV Photoresists for Sub-Quarter Micron Lithography", Semiconductor Fabtech, 6th edition, pp. 215–222, (1996).

10. W. Spiess, S. Funato, Y. Kinoshita, Y. Nozaki, and G. Pawlowski: "High Performance Positive DUV Photoresists AZÒ DX 1100P, AZÒ DX 1200P, AZÒ DX 1300P, AZÒ DX 2034P, AZÒ DX 2058P for Advanced Lithographic Applications", Microelectronic Engineering, Vol. 41/42, pp. 339–342 (1998).

11. H. Fosshaug, A. Bajramovic, J. Karlsson, K. Xing, A. Rosendahl, A. Dahlberg, C. Björnberg, M. Bjuggren, and T. Sandström, "Resist Process Optimization for a DUV Laser Pattern generator", Proceedings of SPIE, Vol. 5256, 23rd Annual BACUS Symposium on Photomask Technology, Monterey, Calif., USA, Sep. 9–12, 2003.

12. C. Jackson, P. Buck, S. Cohen, V. Garg, C. Howard, R. Kiefer, J. Manfredo, and James Tsou, "DUV Laser Lithography for Photomask Fabrication", Proceedings of SPIE, Vol.5256, 23rd Annual BACUS Symposium on Photomask Technology, Monterey, Calif., USA, Sep. 9–12, 2003.

13. H. Fosshaug, A. Bajramovic, J. Karlsson, K. Xing, A. Rosendahl, A. Dahlberg, C. Björnberg, T. Sandström, "DUV Lithography in Laser Pattern Generator Technology", ARCH Interface'2003.

14. T. Sandström, P. Askebjer, J. Sallander, R. Zerne, and A. Karawajczyk "Pattern Generation with SLM", Proceedings of SPIE, Vol. 4562, 21st Annual BACUS Symposium on Photomask Technology, Monterey, Calif., USA, October 3–5, pp. 38–44 (2001).

15. T. Sandström, and N. Eriksson, "Resolution Extensions in the Sigma7000 Imaging Pattern Generator", Proceedings of SPIE, Vol. 4889, 22nd Annual BACUS Symposium on Photomask Technology, Monterey, Calif., USA, October 1–4, pp. 38–44, (2002).

16. J. March, Advanced Organic Chemistry: Reactions, Mechanism and Structure, 3rd Edition, John Wiley & Sons, 1985, Chapter 8.

17. T. Fujimori, S. Tan, T. Aoai, F. Nishiyama, T. Yamanaka, M. Momota, S. Kanna, Y. Kawabe, M. Yagihara, T. Kokubo, S. Malik, and L. Ferreira, "Structural Design of a New Class of Acetal Polymer for DUV Resists", Advances in Resist Technology and Processing XVII, Proceedings of SPIE, Vol. 3999, pp. 579–590 (2000).

18. L. Pain, C. Gourgon, K. Patterson, B. Scarfoglière, S. Tedesco, G. Fanget, B. Dal'Zotto, M. Ribeiro, T. Kusumoto, M. Suetsugu, and R. Hanawa, "Resist Composition Effects on Ultimate Resolution of Negative Tone Chemically Amplified Resist", Advances in Resist Technology and Processing XVIII, Proceedings of SPIE, Vol. 4345, pp. 251–260 (2001).

19. C. Mack, "Lithographic Effects of Acid Diffusion in Chemically Amplified Resists", OCG Microlithography Seminar: Interface'95, October 29–31, San Diego, Calif., 1995.

We claim:

1. A method of lithography for enhancing uniformity of critical dimensions of features patterned onto a workpiece coated with a layer sensitive to an energy beam, using the energy beam and a multipass writing strategy, the method including:
    determining individual doses for writing passes so that the passes will affect said coating substantially equally, thereby enhancing said uniformity of critical dimensions of features;
    exposing said coating using the multipass writing strategy, applying the individual doses in the writing passes; and
    developing said coating.

2. The method according to claim 1, further including: creating said features by a spatial light modulator.

3. The method according to claim 1, wherein said energy beam is a pulsed radiation in the range of EUV-DUV.

4. The method according to claim 1, further including creating said features by a modulator and deflector arrangement capable of deflecting and setting the intensity of said radiation beam.

5. The method according to claim 1, further including creating said features by a diffraction grating.

6. The method according to claim 1, wherein said method includes two exposure passes, of which a first exposure pass has a dose less than half of an exposure threshold and a second exposure pass has a dose greater than half of the exposure threshold.

7. The method according to claim 1, wherein said method includes three exposure passes or more, of which said dose is increased linearly for following passes.

8. The method according to claim 1, wherein said method includes three exposure passes or more, of which said dose is increased exponentially for following passes.

9. The method according to claim 1, wherein said method includes three exposure passes or more, of which said dose is increased logarithmically for following passes.

10. The method according to claim 1, wherein each portion of said workpiece is patterned with a first exposure pass before exposing a next exposure passes.

11. The method according to claim 10, wherein said portions are exposed in the same direction.

12. The method according to claim 10, wherein said portions are exposed in alternating directions.

13. The method according to claim 1, wherein the dose of the last exposure is within the range of 40% to 60% higher than the first exposure.

14. The method according to claim 1, wherein the dose of the last exposure is within the range of 45% to 55% higher than the first exposure.

15. The method according to claim 1, wherein the coating sensitive to electromagnetic radiation is a chemically amplified resist (CAR).

16. The method according to claim 1, wherein said workpiece is a mask substrate.

17. The method according to claim 1, wherein said workpiece is a wafer.

18. The method according to claim 13, wherein four writing passes are used.

19. A method of producing a mask or reticle, according to claim 1, further wherein the workpiece is the mask or reticle, further including patterning the workpiece after developing the coating.

20. A method of producing a layer of a device structure, according to claim 1, further wherein the workpiece is a wafer, further including patterning the workpiece after developing the coating.

21. A method of producing precise structures on a second workpiece according to claim 1, wherein the workpiece of claim 1 is a mask or reticle, further including:
- exposing a layer of radiation sensitive material on the second workpiece using the mask or reticle; and
- patterning a layer of a device structure on the second workpiece using the exposed layer on the second workpiece.

* * * * *